United States Patent
Whitmore et al.

(10) Patent No.: US 12,369,277 B2
(45) Date of Patent: Jul. 22, 2025

(54) COOLING APPARATUS WITH OFFSET FLOW PATHS

(71) Applicant: Motivair Corporation, Lancaster, NY (US)

(72) Inventors: Rich S. Whitmore, East Amherst, NY (US); Timothy A Shedd, Lithia, FL (US)

(73) Assignee: Motivair Corporation, Lancaster, NY (US)

( * ) Notice: Subject to any disclaimer, the term of this patent is extended or adjusted under 35 U.S.C. 154(b) by 0 days.

(21) Appl. No.: 17/972,268

(22) Filed: Oct. 24, 2022

(65) Prior Publication Data

US 2023/0180437 A1    Jun. 8, 2023

Related U.S. Application Data

(63) Continuation of application No. 17/023,028, filed on Sep. 16, 2020, now Pat. No. 11,483,947.

(51) Int. Cl.
  *H05K 7/20* (2006.01)
  *H01L 23/433* (2006.01)
  *H01L 23/473* (2006.01)

(52) U.S. Cl.
  CPC ..... *H05K 7/20345* (2013.01); *H01L 23/4336* (2013.01); *H05K 7/20218* (2013.01); *H01L 23/4735* (2013.01); *H05K 7/20254* (2013.01); *H05K 7/20272* (2013.01)

(58) Field of Classification Search
  CPC .......... H05K 7/20254; H05K 7/20272; H05K 7/20772; H05K 7/20345; H01L 23/4336; H01L 23/4735

USPC .................. 361/699; 165/80.4–80.5, 104.33
See application file for complete search history.

(56) References Cited

U.S. PATENT DOCUMENTS

| | | | |
|---|---|---|---|
| 6,952,346 B2 * | 10/2005 | Tilton | H05K 7/20345 174/15.1 |
| 7,055,341 B2 | 6/2006 | Nori et al. | |
| 9,901,013 B2 | 2/2018 | Shedd et al. | |
| 2009/0120621 A1 | 5/2009 | Sheinman | |
| 2010/0288562 A1 * | 11/2010 | Dove | B05B 1/341 123/299 |
| 2017/0092565 A1 * | 3/2017 | Chen | H05K 7/20281 |

(Continued)

OTHER PUBLICATIONS

Canadian Office Action mailed Dec. 2, 2022 for Canadian Patent Application No. 3,131,057, a foreign counterpart to U.S. Pat. No. 11,483,947, 5 pages.

(Continued)

*Primary Examiner* — Zachary Pape
(74) *Attorney, Agent, or Firm* — Lee & Hayes, P.C.

(57) ABSTRACT

A cooling apparatus for an electronic or computing device includes a base for thermal coupling to a surface of the electronic or computing device and a cover spaced from the base. A nozzle plate is disposed between the base and the cover to partially define an inlet volume and an outlet volume. Cooling fluid enters the inlet volume and passes through the nozzle plate to the outlet volume and out of the apparatus. The nozzle plate includes a plurality of flow paths through which the cooling fluid passes from the inlet volume to the outlet volume. The flow paths cause the fluid to exit the nozzle plate as transversely expanding fluid jets.

20 Claims, 9 Drawing Sheets

(56) References Cited

U.S. PATENT DOCUMENTS

2022/0087061 A1    3/2022   Whitmore et al.

OTHER PUBLICATIONS

Office Action for U.S. Appl. No. 17/023,028, mailed on Jul. 16, 2021, Whitmore, "Cooling Apparatus", 10 pages.
Office Action for U.S. Appl. No. 17/023,028, mailed on Jun. 8, 2022, Whitmore, "Cooling Apparatus", 7 pages.
Canadian Office Action mailed Oct. 3, 2023 for Canadian Patent Application No. 3,131,057, a foreign counterpart to U.S. Pat. No. 11,483,947, 3 pages.

* cited by examiner

COOLING APPARATUS WITH OFFSET FLOW PATHS

CROSS REFERENCE TO RELATED APPLICATIONS

This is a continuation application which claims priority to commonly assigned, co-pending U.S. patent application Ser. No. 17/023,028, filed Sep. 16, 2020. Application Ser. No. 17/023,028 is fully incorporated herein by reference.

TECHNICAL FIELD

This patent disclosure relates generally to cooling apparatuses and, more particularly, to fluid-based cooling systems for use with mechanical, electrical, and/or electromechanical systems.

BACKGROUND

Advances in semiconductors and related fields have resulted in smaller electronic and computing devices having increased power and performance. One result of tasking integrated circuits, servers, processors, and the like, with higher functionality is increased heat generation. However, this increased heat, often coupled with a decreased device size, can result in destructively high heat densities in some devices. Failure to reduce or remove this heat can result in device underperformance and/or premature device failure.

Many conventional cooling methods have been used to reduce heat in electronic and computing devices. For instance, heat sinks have been used in some instances to draw heat away from the heat-generating components. Conventional heat sinks may include thermally conductive materials in proximity of the heat generating components that dissipate heat through an exposed surface. In some instances, air can be passed over the exposed surface of the heat sink to aid in heat dissipation. More recently, pumped liquid cooling systems have been introduced that provide improved thermal performance. In these systems, a liquid coolant is passed through an enclosed volume attached to the heat generating component or component to be cooled. A heat sink may be included in the volume and often includes a plurality of channels that increase the surface area of the heat sink. Advances in these liquid cooling systems have generally focused on further increasing the surface area of the heat sink, e.g., by reducing fin thickness and/or increasing fin density, and/or on generating two-phase fluid, e.g., by atomizing the liquid through increased pressure or other measures. However, fins have a finite thinness, and systems that space fins too closely have failed when particulates and/or other debris carried by the cooling liquid get trapped between the fins. Moreover, attempts to atomize cooling fluid have proven difficult and expensive. Accordingly, there is the need in the art for improved cooling apparatuses that effectively remove heat from electronic and computing devices.

DETAILED DESCRIPTION

This disclosure generally relates to cooling apparatuses, and, more particularly, to cooling apparatuses configured for securement to computing and/or electronic components to remove heat from those devices. In embodiments described herein, the cooling apparatuses may be configured for securement to a server component, a processor, a chip, an integrated circuit, and/or one or more related components. However, this disclosure is not limited to use with computing components, and instead may be used with many types of components and/or assemblies that benefit from improved heat dissipation, as described herein. Wherever possible, the same reference numbers will be used through the drawings to refer to the same features.

Figure 1:
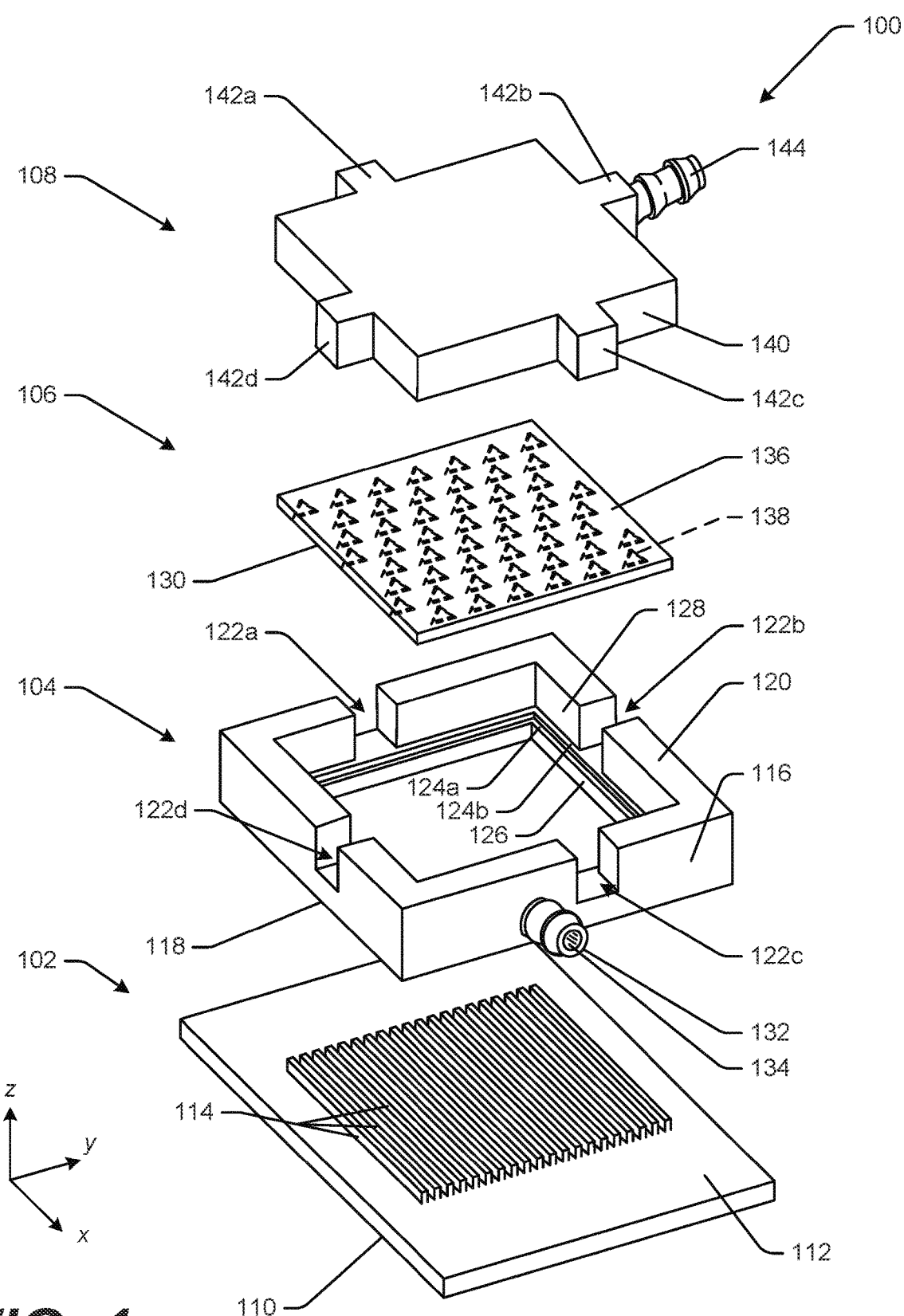
FIG. 1 is an exploded perspective view of a cooling apparatus in accordance with aspects of this disclosure.

FIG. 1 is an exploded perspective view of a cooling apparatus 100 according to aspects of this disclosure. The cooling apparatus 100 includes a base 102, a frame 104 configured for securement to the base 102, a nozzle plate 106 supported by the frame 104, and a cover 108 that cooperatively engages, and is securable to, the frame 104. The base 102, the frame 104, the nozzle plate 106, and the cover 108 will be described briefly in connection with FIG. 1 and detailed further throughout this specification.

The base 102 is generally configured for securement on, or proximate to, a surface to be cooled. As illustrated, the base 102 has a generally planar bottom surface 110 (obscured in FIG. 1) and a generally planar top surface 112. The top surface 112 may be spaced from the bottom surface 110 by a thickness of the base 102. In some examples, the thickness of the base is substantially uniform, e.g., such that the top surface 112 is substantially parallel to the bottom surface 110. As also illustrated in FIG. 1, the base 102 includes a plurality of fins 114 extending from the top surface 112, e.g., in a direction away from the bottom surface 110. The fins 114 comprise a plurality of elongate, parallel protrusions extending in the x-dimension of FIG. 1 and raising a height above the top surface 112 in the z-dimension of FIG. 1.

In examples, the base 102 may be made of a material having a high thermal conductivity. For example, the base 102 may be fabricated of copper or aluminum. In operation, the base 102 may be secured to a surface of a device to be cooled using the cooling apparatus 100. Without limitation, the bottom surface 110 of the base 102 may be secured to contact a surface of an electronic and/or computing device. In some examples, the fins 114 may be formed by conventional machining techniques, such as milling, skiving, or the like. Although FIG. 1 illustrates twenty substantially identical, equally spaced fins 114, this is for example only. In other examples, the fins 114 may be differently sized (e.g., taller, wider), differently shaped (e.g., contoured, stepped), differently oriented (e.g., angled other than shown), differently spaced (e.g., more or less densely arranged), and/or otherwise differently configured. Moreover, more or fewer fins may be used. Moreover, although the fins 114 are illustrated in FIG. 1, in other aspects of this disclosure, the fins 114 may be embodied as other types of surface features, such as pins, columns, dimples, indents, or the like. In examples, the base 102 may include any configuration and/or features that increase surface area or increase heat dissipation. In other examples, the base 102 may not include such features. For example, instead of the fins 114, the base 102 may include a substantially planar, continuous surface, e.g., the top surface 112. In still further examples, the base 102 may include a single, continuous surface spaced from the top surface 112. Such a surface may be provided by a protrusion having a length corresponding to the length (in the x-dimension) of the illustrated fins 114, a width corresponding to the collective width of all of the fins 114 (including the channels formed therebetween—in the y-dimension), and/or a height corresponding to a height (in the z-dimension) of the fins 114, although other shapes, sizes, and/or the like may alternatively be used.

As noted above, the frame 104 is configured to be secured to the base 102. FIG. 1 shows that the frame 104 generally includes a continuous side wall 116 defining a perimeter. In this example, the sidewall 116 is generally square, having four equal sides. The sidewall 116 is configured such that when the frame 104 secured to the base 102, a bottom surface 118 (obscured in FIG. 1) of the frame 104 contacts (or is otherwise sealed relative to) the top surface 112 of the base 102, and the sidewall 116 is disposed around the fins 114.

The frame 104 also includes a first notch 122a, a second notch 122b, a third notch 122c, and a fourth notch 122d (collectively referred to herein as the notches 122). The notches 122 are substantially identical, with one being provided on each segment of the sidewall 116. In more detail, each of the notches 122 is a cutout comprising a break in the sidewall 116 and having a predetermined width. That is, the notches are substantially identical. Moreover, the notches 122 are arranged at predetermined positions, e.g., at equal distances from an adjacent sidewall. As will be described in more detail herein, the notches 122 act as alignment members that promote selective alignment of the cover 108 relative to the frame 104.

The frame 104 also includes a first shelf or ledge 124a and a second shelf or ledge 124b on an inner periphery of the sidewall 116. The first ledge 124a provides a surface that supports the nozzle plate 106, e.g., by contacting an outer periphery of a bottom surface 130 (obscured in FIG. 1) of the nozzle plate 106. The second ledge 124b provides a surface that supports the cover 108. In the illustrated example, an inner surface of the sidewall 116 has a stepped profile, such that a lower segment 126 of the sidewall 116 extends further, e.g., toward a center of an area defined by the sidewall 116, than an upper segment 128 of the sidewall 116. This stepped profile provides the first ledge 124a and the second ledge 124b at the inner periphery of the sidewall. However, in the illustrated example, the lower segment 126 and the upper segment 128 are continuous on an outer surface of the sidewall 116, although such may not be required. As also illustrated in FIG. 1, the notches 122 extend (in the z-dimension of FIG. 1) from the top surface 120 of the sidewall 116 to the second ledge 124b. However, the notches 122 can be shallower or deeper than is illustrated.

The frame 104 also includes an outlet port 132 extending from the sidewall 116. The outlet port 132 defines an opening 134 to a passageway that extends through the sidewall 116 and opens to the volume defined by the sidewall 116. As detailed further herein, fluid that contacts the fins 114 of the base 102 leaves the cooling apparatus 100 via the outlet port 132. The outlet port 132 is configured as a nozzle in the example of FIG. 1, although the outlet port 132 may take other forms in other embodiments. For example, and without limitation, the outlet port 132 may include a push-to-connect fitting, a compression fitting, a flare fitting, or other fitting. In examples, the outlet port is configured to secure a conduit, e.g., a hose, tubing, or the like, to the frame 104. More specifically, fluid exiting the cooling apparatus 100 via the outlet port 132 is carried away, e.g., to a pump, heat exchanger, or other component, via the conduit attached to the outlet port 132.

The nozzle plate 106 is generally configured to control the flow of fluid, e.g., single-phase fluid, for contact with the fins 114 of the base 102. The nozzle plate 106 is a generally planar member having a substantially constant thickness between a top surface 136 and the bottom surface 130. The nozzle plate 106 has a plurality of flow paths 138 formed therein. In more detail, the flow paths 138 extend through the nozzle plate 106 from an inlet opening in the top surface 136 to an outlet opening in the bottom surface 130. As detailed further herein, the flow paths 138 are configured such that fluid entering the flow paths 138, e.g., from above the top surface 136 of the nozzle plate 106, leaves the flow paths 138, e.g., from the bottom surface 130 of the nozzle plate 106, as laterally-expanding, single phase fluid jets. Specifically, the laterally-expanding fluid jets impinge on the base 102, e.g., the fins 114 of the base 102, and then exit the cooling apparatus 100 via the outlet port 132, as discussed above.

The nozzle plate 106 can include an array of flow paths 138. In the example of FIG. 1, the flow paths are arranged in a plurality of rows spaced in the x-dimension and generally extending in the y-dimension of FIG. 1. Also in the illustrated example, flow paths in one row are offset, e.g., in the x-dimension, relative to flow paths in an adjacent row or adjacent rows. By staggering the flow paths 138 in this manner, impingement of cooling fluid on the fins 114 of the base 102 may be increased. However, the illustrated arrangement is for example only and other configurations will be appreciated. For instance, the flow paths may be aligned in both the x- and y-dimensions. Also, more or fewer flow paths may be provided. The nozzle plate 106 is described in more detail below, e.g., in connection with FIGS. 3A-3C, and modifications to the nozzle plate are illustrated in FIGS. 6A-6C, 7A, 7B, 8A, and 8B, described further below.

The cover 108 is generally configured for placement over the nozzle plate 106 and in cooperation with the frame 104. Although obscured in FIG. 1, an underside of the cover 108, e.g., facing the top surface 136 of the nozzle plate 106, includes a cavity (shown and described in more detail in connection with FIGS. 4A-4C) such that when the cover 108 is placed on the nozzle plate 106, an outer periphery of the underside of the cover 108 rests on the second ledge 124b and may partially contact an outer periphery of the top surface 136 of the nozzle plate 106. As also illustrated, the cover 108 is defined on lateral edges by segments of a sidewall 140. The sidewall 140 is shaped and sized to be received within an opening defined by the sidewall 116 of the frame 104. The cover 108 also includes a first tab 142a, a second tab 142b, a third tab 142c, and a fourth tab 142d (collectively, the tabs 142) extending laterally from the sidewall 140. The tabs 142 are sized and positioned to be received in the notches 122. That is, the tabs 142 are alignment features that cooperate with the notches 122 to position the cover 108 relative to the frame 104.

The cover 108 also includes an inlet port 144 extending from the second tab 142b. The inlet port 144 defines an opening (not visible in FIG. 1) that extends through the second tab 142b and the sidewall 140 and opens to the volume defined by the cavity in the underside of the cover 108 (shown in detail in FIGS. 4A and 4B, discussed below). As detailed further herein, fluid enters the cooling apparatus 100 via the inlet port 144. The inlet port 144 is configured as a nozzle or nipple in the example of FIG. 1, although the inlet port 144 may take other forms in other embodiments. For example, and without limitation, the inlet port 144 may include a push-to-connect fitting, a compression fitting, a flare fitting, or other fitting. In examples, the inlet port 144 is configured to secure a conduit, e.g., a hose, tubing, or the like, to the cover 108. In some examples, fluid entering the cooling apparatus 100 via the inlet port 144 may be a cooled fluid supplied by a pump or other fluid source via the conduit secured to the inlet port 144.

The tabs 142 and the notches 122 are configured to provide selective orientation of the inlet port 144 relative to the outlet port 132. For instance, in the example shown, the inlet port 144 is rotated 90-degrees relative to the outlet port 132. However, in other configurations, the inlet port is otherwise arranged. For instance, if the cover 108 is turned 90-degrees clockwise relative to the illustrated arrangement, the second tab 142b would be arranged to be received in the third notch 122c, the third tab 142c would be arranged to be received in the fourth notch 122d, and so forth. In this configuration, the inlet port 144 and the outlet port 132 would be substantially parallel. Thus, the cooling apparatus 100 may be configured in four different orientations, e.g., by rotating the cover 108 in 90-degree increments. For example, different configurations may provide greater flexibility in installation and connection of the cooling apparatus to conduits or the like. In the illustrated example, four configurations are provided by the generally square shape of the frame 104 (e.g., the sidewall 116) and the cover 108 (e.g., the sidewall 140). Other shapes may provide more or fewer configurations. For instance, if the frame 104 and the cover 108 are substantially rectangular, only two orientations may be possible. However, additional-sided polygons can provide additional orientations. For instances, if the frame 104 and the cover 108 are embodied as hexagons, notches like the notches 122 can be formed in each of the six sides of the frame and tabs like the tabs 142 can be formed on each of six sides, which could allow for six configurations. Moreover, a circular shape may provide for additional configurations, e.g., numbering as many as the notches and tabs formed on the cooperating circular frame 104 and the circular cover 108. This disclosure is also not limited to the notches 122 and the tabs 142 as alignment features. In the case of a circular shape for the frame 104 and the cover 108, the cover 108 may rotate freely relative to the circular frame 104 and other fastening techniques may be implemented to secure the cover 108 to the frame 104. Without limitation, mechanical fasteners, latches, compression features, snap features, or the like may be used to secure the cover 108 to the frame 104.

Although the cooling apparatus 100 is illustrated as the four components, e.g., the base 102, the frame 104, the nozzle plate 106, and the cover 108, some additional components are omitted for clarity. For instance, gaskets, seals, and/or the like may be situated between adjacent components to prevent fluid leaking from volumes defined by the components, as described further herein. Moreover, fasteners are not illustrated. In at least some examples, and without limitation, the frame 104 may be secured to the base 102 using conventional fasteners, e.g., bolts or screws, that pass through mounting holes (not shown) extending from a top surface 120 of the frame 104, through the sidewall 116, and through the bottom surface 118 into threaded holes (not shown) in the base 102. This is for example only; other fastening arrangements are contemplated. In at least one other configuration, threaded fasteners may be passed through the base 102 and received in threaded opening in the frame 104 or the cover 108. Moreover, and although not illustrated in FIG. 1, a gasket may be provided between the top surface 112 of the base 102 and the bottom surface 118 of the frame 104 to seal the surfaces. A channel or other feature may be formed in one or both of the base 102 and the frame 104 to retain the gasket. Gaskets may be used similarly between abutting surfaces when a seal is desired. Also in alternative examples, the four illustrated components may be embodied as more or fewer components. For example, certain of the components, like the base 102 and/or the frame 104 may be fabricated as two or more components. Similarly, in some examples two or more of the frame 104, the nozzle plate 106, and/or the cover 108 may be formed as a unitary piece. Without limitation, the frame 104 and the cover 108 may be formed as a unitary piece that receives the nozzle plate and attaches to the base 102, for instance. This example may not provide for selective configuration of the inlet port 144 and/or the outlet port 132, as just described.

Figure 2:
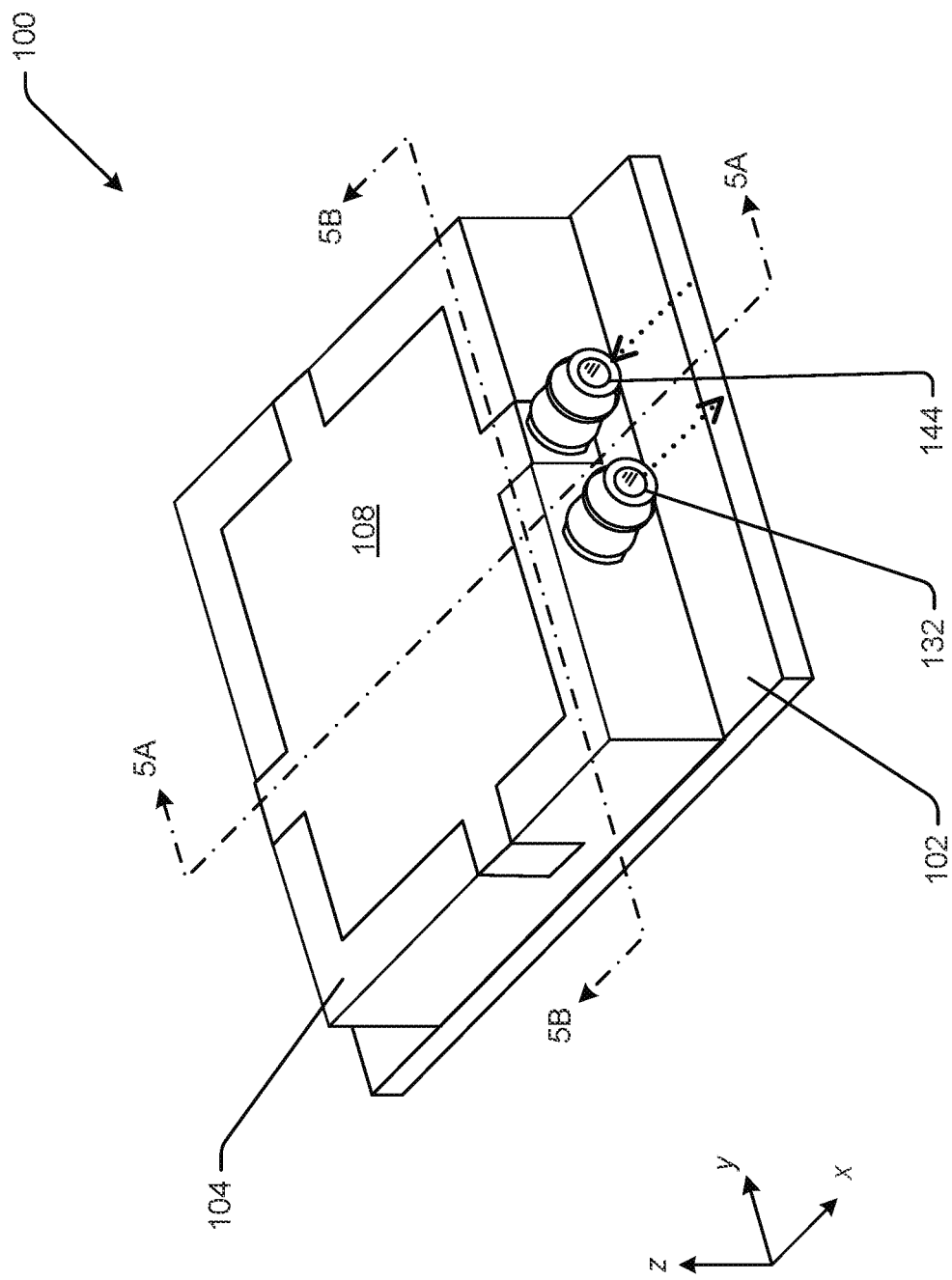
FIG. 2 is a perspective view of the cooling apparatus of FIG. 1 assembled and in a configuration in which a cover is rotated 90-degrees relative to the view of FIG. 1, in accordance with aspects of this disclosure.

FIG. 2 illustrates the cooling apparatus 100 in an assembled state. As illustrated, the cooling apparatus 100 is a compact, low-profile system. In the assembled state, the frame 104 is coupled to the base 102 and the cover 108 is coupled to the frame 104. The nozzle plate 106 is disposed between the cover 108 and the frame 104 and is not visible in FIG. 2. When assembled, the tabs 142 are received in the notches 122 in an orientation rotated relative to the configuration shown in FIG. 1. More specifically, the cover 108 is rotated clockwise 90-degrees relative to the orientation shown in FIG. 1. Accordingly, the inlet 144 and the outlet 132 are adjacent each other and generally parallel, as opposed to the normal relationship shown in FIG. 1. In some examples, the base 102 may be formed of a high thermal-conductivity material, such as copper or aluminum. The frame 104, the cooling plate 106, and/or the cover 108 may be formed of a different material, such as a polymer, a metal, or other material. Although not illustrated, mounting holes may be formed through the base 102 to facilitate mounting of the assembled cooling apparatus 100 to a heat-generating component. Additional aspects of the cooling apparatus 100 will now be described in more detail.

Figure 3A:
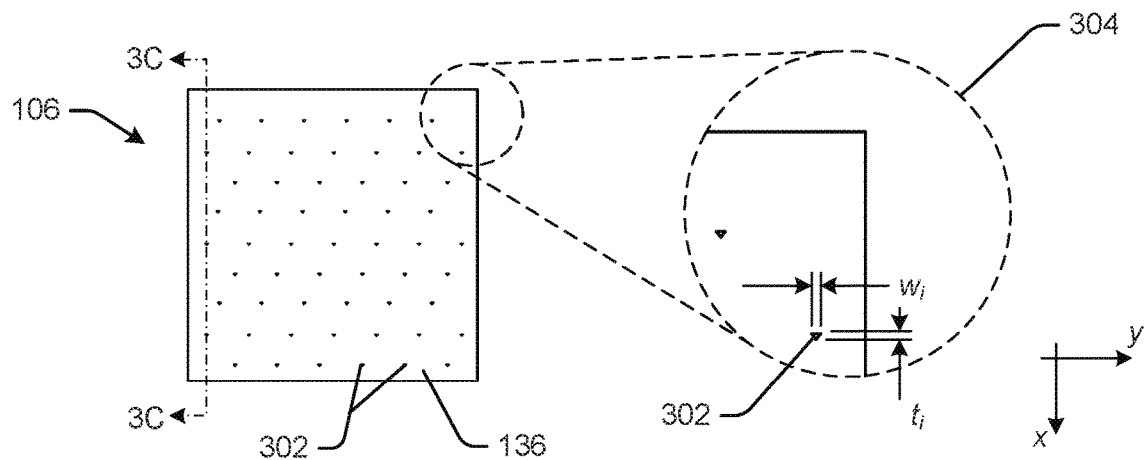
FIGS. 3A, 3B, and 3C are, respectively, a top plan view, a bottom plan view, and a cross-sectional view along the line 3C-3C in FIG. 3A of a nozzle plate for use in a cooling apparatus, in accordance with aspects of this disclosure.
Figure 3B:
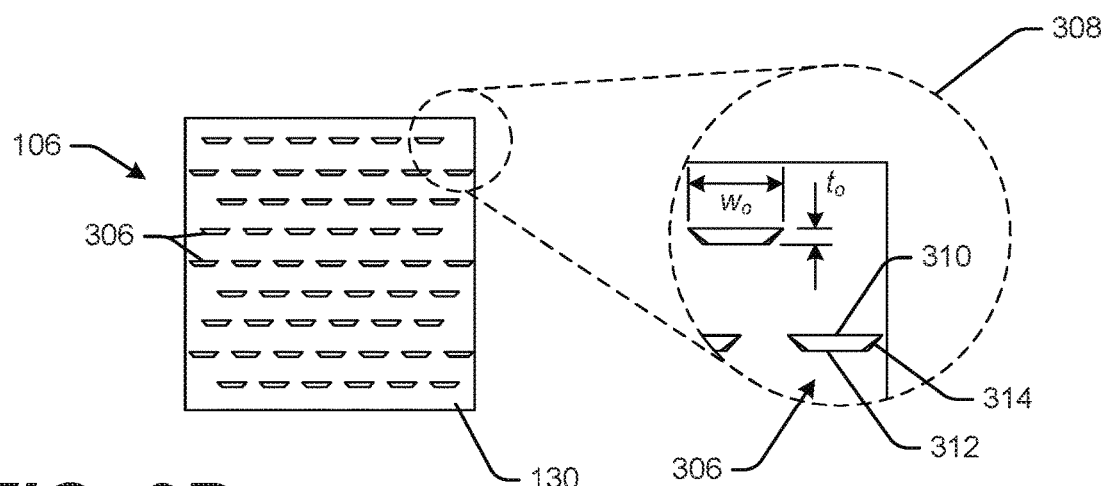
Figure 3C:
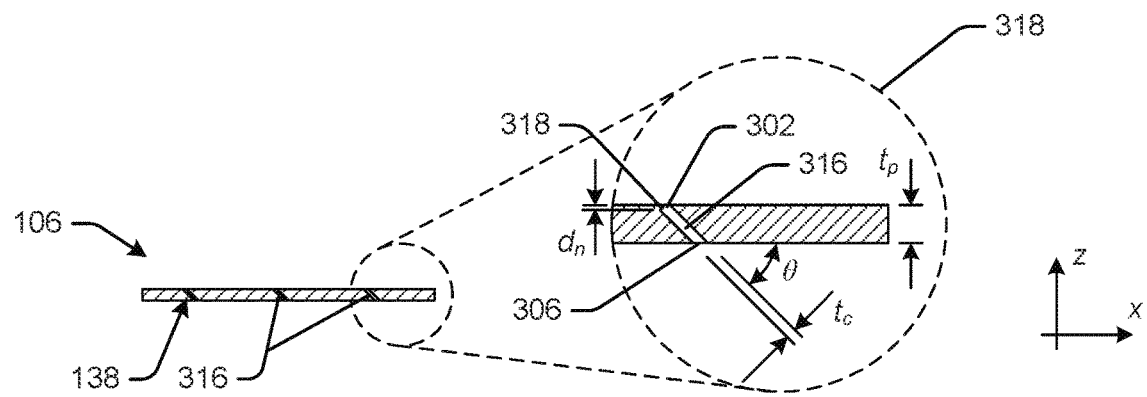

FIGS. 3A-3C show the nozzle plate 106 in more detail. More specifically, FIG. 3A is a top view of the nozzle plate, showing the top surface 136 of the nozzle plate 106, FIG. 3B is a bottom view, showing the bottom surface 130 of the nozzle plate 106, and FIG. 3C is a cross-sectional view taken along section line 3C-3C in FIG. 3A. As generally described above in connection with FIG. 1, the nozzle plate 106 includes a number of flow paths (the flow paths 138) formed through the nozzle plate 106 and through which fluid can pass through the nozzle pate 106. Fluid introduced at the top surface 136 of the nozzle plate 106 passes through the flow paths and exits proximate the bottom surface 130 of the nozzle plate 106. FIG. 3A shows an array of inlets 302 at the top surface 136. A magnified portion 304 of FIG. 3A shows one of the inlets 302 in more detail. As illustrated, the inlet 302 is generally triangular having a hypotenuse extending generally laterally, e.g., in the y-dimension, and legs extending at 45-degree angles to form an apex spaced from the hypotenuse in the x-dimension. In this arrangement, a length of the hypotenuse is a lateral width of the inlet, and a distance between the hypotenuse and the apex is a thickness of the inlet, $t_i$.

FIG. 3B shows an array of outlets 306 formed in the bottom surface 130 of the nozzle plate 106. As will be appreciated, each of the outlets 306 is associated with one of the inlets 302. Specifically, each of the inlets 302 is connected to one of the outlets 306 via a channel, as described further herein. As best shown in the magnified portion 308 of FIG. 3B, each of the outlets 306 is generally trapezoidal in shape having a first, longer leg 310, a second, shorter leg 312 and opposite side edges 314. In this example, the first leg 310 is spaced from the second leg 312, e.g., in the x-dimension, by an outlet thickness, to. A width of the outlet, $w_o$, e.g., measured in the y-dimension, is the length of the first leg 310. In this example, the side edges 214 are angled relative to the first leg 310 and the second leg 312 by about 45-degrees, although other angles may be used.

As will be appreciated from FIG. 3A and FIG. 3B, the inlet width, $w_i$, is significantly smaller than the outlet width, $w_o$. Also in the illustrated example, the inlet thickness, is smaller than the outlet thickness, $t_o$, although, as detailed further herein, such may not be required. In aspects of this disclosure, an area of one of the inlets 302, e.g., a two-dimensional area measured in the plane of the top surface 136, is smaller than an area of one of the outlets 306, e.g., a two-dimensional area of the outlet 306 measured in the plane of the bottom surface 130 of the nozzle plate 106. Accordingly, fluid introduced at the inlet 302 expands as it travels through the nozzle plate 106 and exits via the outlets 306. In particular, the fluid expands to create transversely expanding single phase fluid jets proximate the outlets 306, as described further herein. Although the example of FIGS. 3A and 3B show expansion from the inlet 302 to the outlet 306 in the y-direction, e.g., laterally, other implementations may provide for transverse expansion in any other direction. Without limitation, the outlet thickness, $t_o$, may be larger than the inlet thickness, whereas the inlet width, $w_i$, and the outlet width $w_o$, may be substantially the same. In other examples, the expansion may occur in both the thickness and width and/or in other directions.

FIG. 3C is a cross-section of the nozzle plate 106 taken along section line 3C-3C in FIG. 3A and shows a channel 316 extending between one of the inlets 302 and one of the outlets 306. Channels similar to or the same as the channel 316 may be provided to connect other of the inlets 302 with other of the outlets 306. More specifically, and as shown best in a magnified portion 318, the channel 316 extends from one of the inlets 302 to one of the outlets 306 through a thickness of the nozzle plate, $t_p$. In this example, the channel 316 is angled relative to both the top surface 136 and the bottom surface 130 of the nozzle plate 106. In the illustrated cross-section, the channel 316 is at a channel angle θ relative to the bottom surface 130 (and the top surface 136). In the illustrated example, the angle θ is approximately 45-degrees, although the channel angle θ may be varied. As will be appreciated, varying the channel angle θ will alter an angle at which fluid exiting the outlet 306 will impinge the base 102, as described further herein. As also illustrated in the magnified portion 318, the channel 316 has a thickness, $t_n$. The thickness is substantially uniform from a position proximate the inlet 302 to the outlet 306. According to this configuration, once fluid enters the channel 316 via the inlet 302, fluid will laterally disperse, e.g., in a direction normal to the viewing plane of FIG. 3C, because the channel expands laterally, e.g., in the y-dimension.

As illustrated further in FIG. 3C, the channel 316 does not extend entirely through the top surface 136. Instead, an undercut 318 is provided proximate the top surface 136, resulting in the inlet 302 having a smaller opening in the x-dimension than the outlet 306. In the illustrated embodiment, the undercut 318 extends at approximate 90-degrees relative to the axial direction of the channel 316, e.g., normal to the channel angle θ. The undercut 318, along with the inlet 302 creates a nozzle proximate the inlet 302. As illustrated in FIG. 3C, the undercut 318 extends a depth, e.g., a nozzle depth, $d_n$, in the z-dimension. In some examples, geometries of the inlet 302, the channel 316, and/or the undercut 318 may alter flow properties of the fluid passing through the nozzle plate 106, e.g., without changing a phase of the fluid. Without limitation, the inlet 302, the channel 316, and/or the undercut 318 may cause fluid, such as water, passing through the inlet 302 to disperse transversely outwardly. These transversely expanding jets may further expand, as constrained by the channel 316, to the outlet 306. Thus, in some examples, a nozzle-type structure proximate the inlet 302 causes an initial transversely expanding dispersion of fluid, and the shape of the channel 316, e.g., having a transversely expanding shape, may promote further, constrained dispersion of the fluid.

The geometry illustrated in FIG. 3C, e.g., with the undercut 318, may result from manufacture of the nozzle plate 106. In some examples, the nozzle plate 106 may be formed using conventional additive or subtractive machining techniques. In an additive process, such as injection or other molding, the flow paths 138 may be formed by molding around an array of plates provided in the mold. For instance, square plates having a thickness corresponding to the nozzle thickness, tn, may be angled at an angle corresponding to the channel angle θ, such that a corner of each of the square plates is highest, e.g., in the z-dimension of FIG. 3C. Molding around the plates such that a bottom surface of the square plates at the highest corner is covered in mold material will result in the undercut 318. Such a technique will also result in the triangular-shaped inlet 302 and the trapezoidal-shaped outlet. In a subtractive machining technique, a cutting tool may be plunged or otherwise inserted into the nozzle plate 106 along the channel angle θ, to form the channel 316, including the undercut 318.

As described above, the undercut 318 may function with the inlet 302 and the channel 316 to cause fluid entering the inlet 302 to create transversely-expanding single phase fluid jets. In examples, the geometries of the inlet 302, the outlet 304, the channel 316, and/or the undercut 318 may be altered to create different transversely expanding jets. For instance, the rate at which the channel 316 in one or both of the width and height dimensions may alter the jet exiting the outlet 304. Similarly, varying the angle of the undercut 318 and/or the channel 316 can cause different behavior at the inlet. In the illustrated example the undercut 318 and the channel 316 result in sharp edges at the periphery of the inlet 302, e.g., rapidly increasing in diameter at depths from the top surface 136 of the nozzle plate 106. In some examples, varying the thickness of the nozzle plate, $t_p$, and/or the depth of the undercut, e.g., $d_n$, may vary the flow passing through the inlet. For instance, and without limitation, the depth of the undercut 318 may be smaller than a diameter of the inlet 302. For non-circular inlets, e.g., the triangular inlet 302, the hydraulic diameter of the inlet may be greater than the depth, $d_n$. In other examples, the diameter, e.g., hydraulic diameter, may be the same as, or larger than, the depth, $d_n$.

The arrangement of FIGS. 3A, 3B, and 3C, provides for an example arrangement in which water jets emanating from the outlets 306 include a transverse velocity component, e.g., angled relative to an axial direction of the flow, such as in the y-dimension of FIG. 3A and/or angled relative to the channel angle θ in the x-z plane. In the illustrated example of FIGS. 3A-3C, the shape of the inlet 302 and the outlet 306 in FIG. 3A will result in transversely expanding jets that are generally fan-shaped, e.g., expanding in the y-dimension, but having a generally constant thickness, e.g., corresponding to the nozzle thickness, $t_n$. As detailed above, in the illustrated example, the undercut 318, together with inlet 302 and the channel 316, may act as a thin orifice or nozzle, causing fluid entering the inlet 302 to transversely expand as it enters the channel 316. This transverse expansion results in a single-phase jet, e.g., as opposed to an atomized spray. Accordingly, aspects of this disclosure have a lower pressure drop than two-phase (e.g., liquid to gas) designs, but provide transverse expansion for greater surface area coverage, as described herein. Moreover, because the channels 316 transversely expand, e.g., in the y-dimension of FIGS. 3A-3C, the jets further expand as they pass to and through the outlet 304. In addition, because the channels 316 are generally aligned at 45-degrees relative to the bottom surface 130 of the nozzle plate 106, the transversely expanding jets will exit the outlets 306 generally at a 45-degree angle. The transversely expanding jets are shown in more detail in FIGS. 5A and 5B, detailed below.

The shapes, widths, thicknesses, and angles illustrated in FIGS. 3A, 3B, and 3C are for example, and modifications to one or more of these parameters may result in different outcomes, e.g., different shapes, sizes, impingement angles, or the like. In one example, the plate thickness, $t_p$, may be up to about 2.5 mm and the outlet width $w_o$, may also be up to about 2.5 mm. The inlet width, or a hydraulic diameter of the inlet, may be less than about 0.5 mm and the channel angle, as noted above, may be about 45-degrees. In other examples, however, the plate thickness, $t_p$, and the outlet width $w_o$, may vary from about 0.1 mm to about 10 mm, the inlet width, or hydraulic diameter, may be on the order of from about 1 μm to about 1 mm, and the channel angle may vary from about 10-degrees to 90-degrees.

Figure 4A:
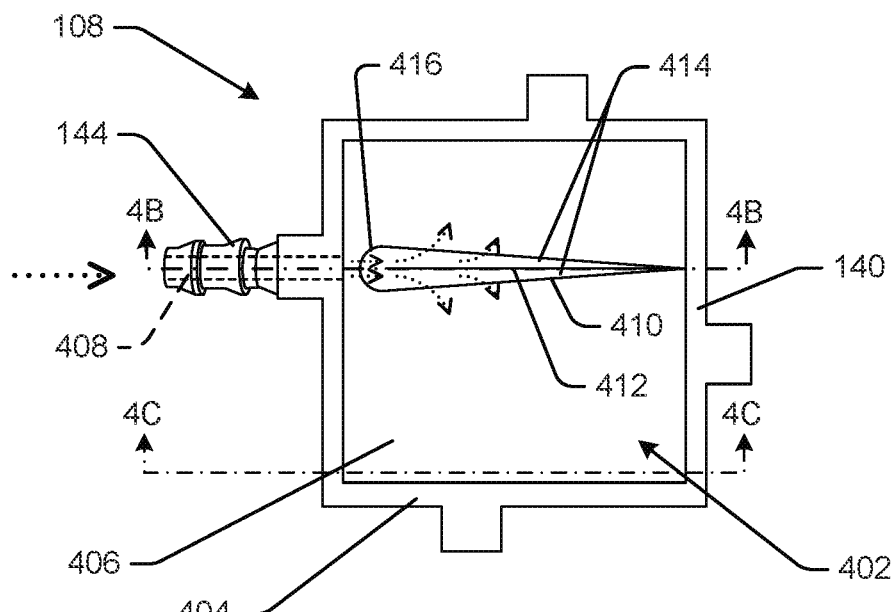
FIGS. 4A, 4B, and 4C are, respectively, a bottom plan view, a first cross-sectional view along the line 4B-4B in FIG. 4A, and a second cross-sectional view along the line 4C-4C in FIG. 4A of a cover for use in a cooling apparatus, in accordance with aspects of this disclosure.
Figure 4B:
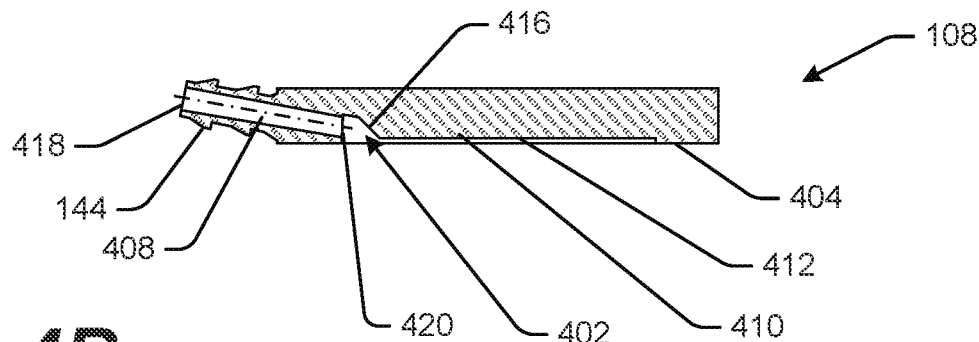
Figure 4C:
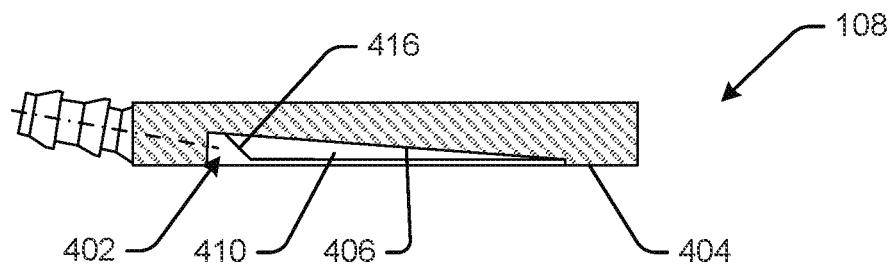

FIGS. 4A-4C show the cover 108 in more detail. More specifically, FIG. 4A is a bottom view of the cover 108, FIG. 4B is a cross-sectional view along section line 4B-4B in FIG. 4A, and FIG. 4C is a cross-sectional view along section line 4C-4C in FIG. 4A. These figures will be discussed in turn.

As shown in FIG. 4A, the cavity 108 defines a cavity 402 generally circumscribed by the sidewall 140 and extending from a bottom surface 404 of the cavity 402 to an upper cavity surface 406. The tabs 142 also are illustrated, as is the inlet port 144. The inlet port 144 defines a portion of a passageway 408 that also passes through the associated one of the tabs 142 and into the cavity 402. A flow diverter 410 optionally is formed on the upper cavity surface 406, generally as a protrusion extending from the upper cavity surface 406 into the cavity 402. The flow diverter 410 is an elongate feature, having a ridge 412 or apex generally aligned with the passageway 408 and having opposite, inclined sides 414 extending from the ridge 412 to the upper cavity surface 406. A leading edge 416 of the flow diverter, e.g., proximate the passageway 408 may also be inclined from a termination of the ridge 412 to the upper cavity surface 406. The leading edge 416 is illustrated as being generally arcuate, although other shapes, e.g., angled, straight, or the like, may alternatively be used.

FIG. 4B shows additional features of the cover 108. More specifically, FIG. 4B is a cross-sectional view that bisects the flow diverter 410, e.g., along the ridge 412. As shown in FIG. B, the passageway 406 extends axially from a first opening 418 of the inlet port 144 to a second opening 420 at the cavity 402. As shown, the leading edge 416 is angled relative to the bottom surface 404 of the cover 108. In this example, the ridge 412 is substantially parallel to the bottom surface 404, although such is not required.

FIG. 4C shows still further features of the cover 108. More specifically, FIG. 4C is a cross-sectional view parallel to the cross-sectional view of FIG. 4B, but laterally away from the flow diverter 108. FIG. 4C shows the upper cavity surface 406 in more detail. In some examples of this disclosure, the upper cavity surface 406 may be angled relative to the bottom surface 404, such that the cavity 402 does not have a uniform depth. In this example, a distance between the upper cavity surface 406 and the bottom surface 404 is larger proximate the nozzle and smaller farther from the nozzle. In some examples, the distance from the upper cavity surface 406 may vary from about 0.1 mm or smaller to about 1.0 mm or larger. As also shown in FIG. 4C, because the upper cavity surface 406 is not parallel to the bottom surface 404, the sides 414 vary in length, e.g., from the ridge 412 to the upper cavity surface 406.

In operation, the inner cavity 402 defines a portion of an inlet volume, e.g., for receiving cooling fluid that passes through the nozzle plate. Features of the cover 108 also aid in dispersion of the fluid in the cavity 402. For instance, the flow diverter 408 functions to laterally (relative to the axial direction of the passageway 408) divert cooling fluid that enters the cavity 402. More specifically, and as illustrated by the arrows in FIG. 4A, fluid that enters the inlet port 144 generally passes axially through the passageway 408 and enters the cavity 402 at a single orifice. The flow diverter 410 is configured to divert the incoming flow of fluid to either lateral side of the flow diverter 408, e.g., to improve dispersion of the fluid in the cavity 402, and therefore over the nozzle plate 106. Moreover, the varying depth of the cavity 402, e.g., resulting from the tapered or angled upper cavity surface 406 may help to normalize fluid pressure in the cavity 402. For instance, as cooling fluid enters the cavity 402, some of the fluid passes through the nozzle plate 106, thereby reducing the amount of fluid that advances to distances farther from the second opening 420. The angled upper cavity surface 406 reduces the volume or headspace available to the fluid farther from the second opening 420, thereby maintaining a more consistent pressure, even when less fluid is present.

Modifications to the cover 108 also are contemplated. For example, the flow diverter 410 may be other than axially-aligned with the passageway 408. The ridge 412 may be angled relative to the axis of the passageway or curved, for instance. Moreover, the angles of the lateral sides 414 may be varied. The upper cavity surface 406 may also be altered from the illustrated example. In some instances, the upper cavity surface 406 may be parallel to the bottom surface 404. For instance, a constant distance between the upper cavity surface 406 and the bottom surface 404 may be from about 0.25 mm to about 1.0 mm. In still other embodiments, the upper cavity surface 406 may include additional angles to further alter the volume defined by the cavity 402. For instance, while FIGS. 4A-4C contemplate only a two-dimensional taper, e.g. from a side proximate the nozzle to an opposite side, the upper cavity surface may angle in three-dimensions. In one example, the upper cavity surface may be farthest from the bottom surface 404 proximate the second opening 420 and angle toward the bottom surface 404 in all directions. For instance, the upper cavity surface 406 may have a same distance from the bottom surface 404 at radial distances from the second opening 420.

Figure 5A:
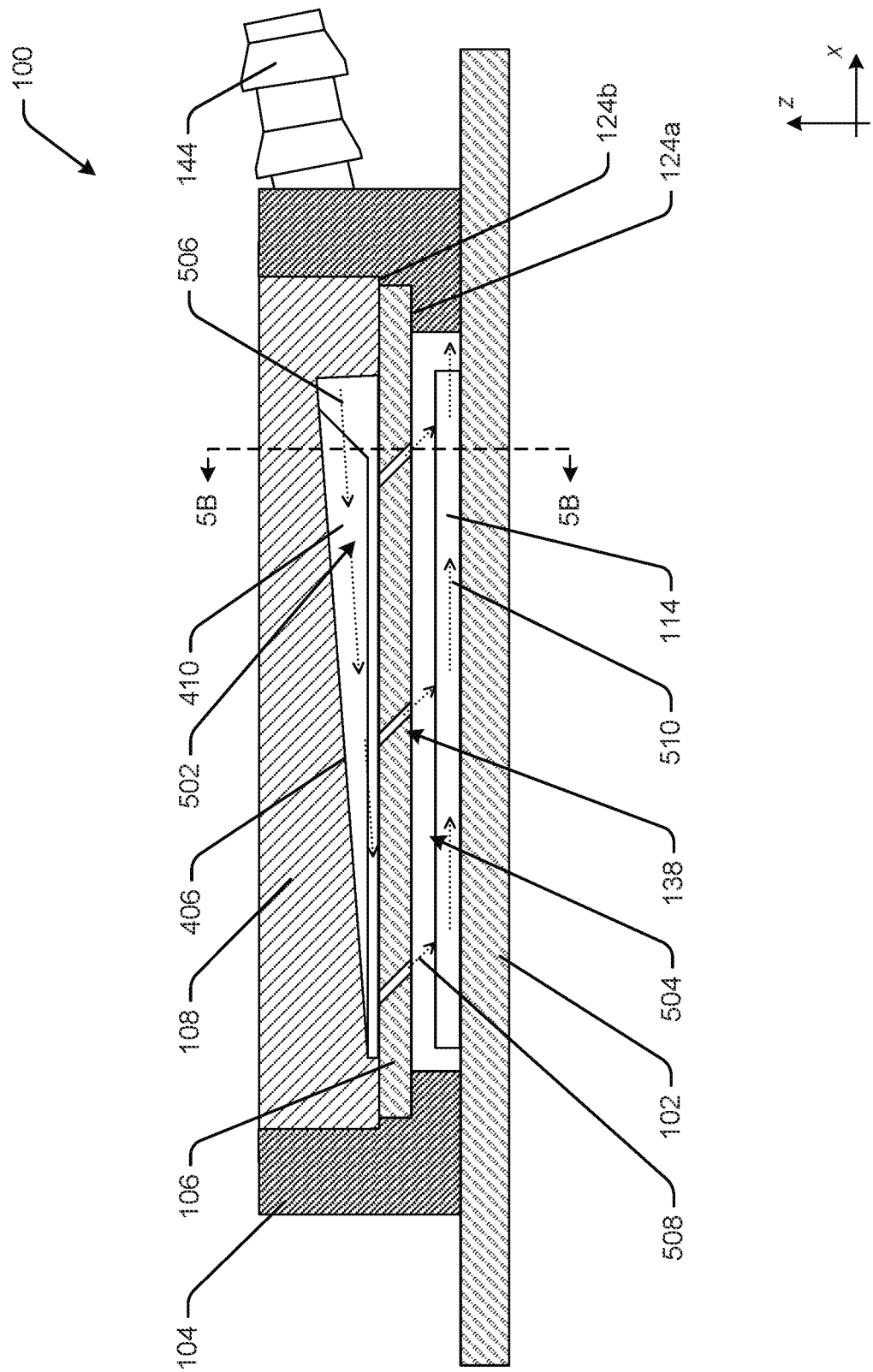
FIGS. 5A and 5B are, respectively, cross-sectional views along the section lines 5A-5A and 5B-5B in FIG. 2, in accordance with aspects of this disclosure.
Figure 5B:
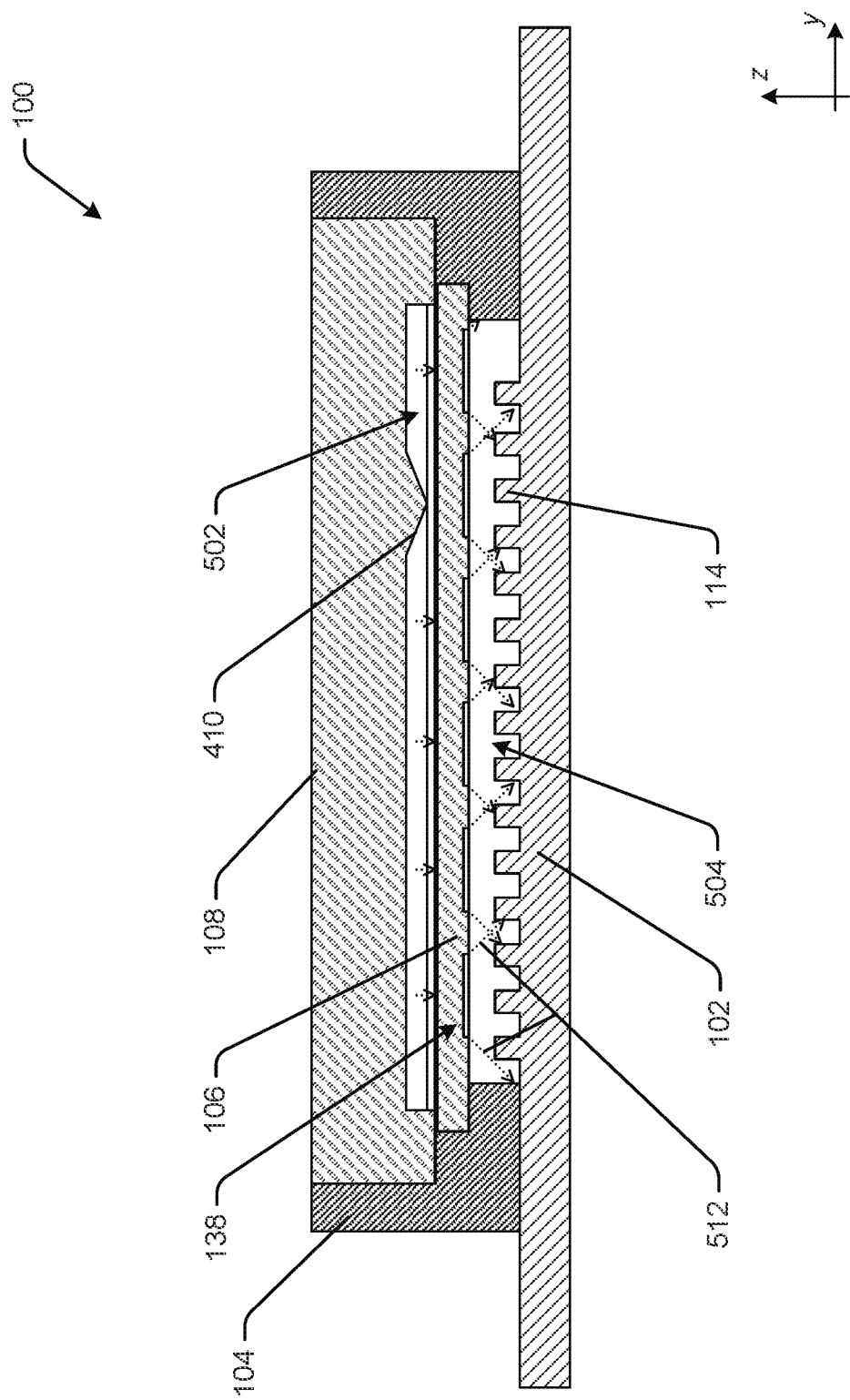

FIGS. 5A and 5B are cross-sectional views taken along section lines 5A-5A and 5B-5B, respectively, in FIG. 2. Additional features and operation of the cooling apparatus will be detailed further in connection with FIGS. 5A and 5B.

As illustrated in FIG. 5A, the frame 104 is coupled to the base 102, the nozzle plate 106 is coupled to the frame 104, e.g., on the first ledge 124a, and the cover 108 is coupled on the frame, e.g. on the second ledge 124b and/or the nozzle plate 106. The cover 108 and the nozzle plate 106 define a first volume 502, e.g., an inlet volume. The nozzle plate 106, the frame 104, and the base 102 define a second volume 504, e.g., an outlet volume. The first volume 502 generally corresponds to the cavity 402 in the cover 108, discussed above. The fins 114 are disposed in the second volume 504.

In operation, cooling fluid, e.g., a single-phase cooling fluid, which may be water, refrigerant, or the like, is introduced into the first volume 502 e.g., via the inlet port 144, generally as shown by the arrows 506. As detailed above, the fluid may be diverted by the flow diverter 410 and/or compressed by the upper cavity surface 406. As the fluid is dispersed through the first volume 502, the fluid also passes, e.g., under the influence of gravity and/or pressure from the incoming fluid, through the nozzle plate 106, via the flow paths 138. More specifically, the fluid generally emerges from the nozzle plate 106 as transversely-expanding fluid jets, generally as shown by arrows 508. In this example, the flow paths 138 are configured to direct the jets to impinge the base 102, e.g., the fins 114 or spaces between the fins 114, at an angle. In this example, an x-component of the jets represented by the arrows 508 is opposite that of an x-component of the flow of the fluid entering the inlet volume 502, e.g. represented by the arrows 506. As noted above, the cover 108, and thus the inlet port 144, may be configured in four orientations, in which the fluid flow represented by the arrows 506 can be otherwise oriented relative to the flow paths 138. Because of the construction of the nozzle plate, a predominant direction of flow above the nozzle plate, e.g., in the first volume 502, may be irrelevant to performance of the flow paths 138. The jets emerging from the nozzle plate 106 enter the outlet volume 504, impinge the base 102, and pass toward an outlet, e.g., generally as shown by arrows 510. At the outlet, the fluid may be transported away from the cooling apparatus via an outlet port (such as the outlet port 132, not shown in FIG. 5A). As noted above, the emerging jets are angled relative to the base 102, and the nozzle plate 106 may be arranged such that the angled jets are directed generally toward the outlet port. In this arrangement, jets farther from the outlet port may help "push" fluid toward the outlet. In other examples, one or more channels, diverters, or other features may be used to direct fluid from the outlet volume 504 toward the outlet port.

FIG. 5B shows the cooling apparatus 100 in the y-z plane (of FIG. 2). The view of FIG. 5B better shows the lateral aspects of the flow paths 138 and their impact on fluid flow through the nozzle plate 106. More specifically, and as detailed above, the flow paths 138 increase in width, e.g., from the inlet width, $w_i$, to the outlet width, $w_o$. As a result, the jets emerging from the flow paths 138, that is, into the outlet volume 504, are transversely expanding, generally as shown by the arrows 512. Accordingly, in addition to being angled in the x-z plane, as shown in FIG. 5A, portions of the jets emerging from the nozzle plate 106 also are angled in the y-z plane. The transversely expanding jets may have a transverse velocity that is at least ten percent of the axial velocity of the jet and results from the design of the flow paths 138 in the nozzle plate 106. The transversely expanding jets of this disclosure are distinguished from natural expansion of a jet entering a low or zero momentum fluid into which the jet is injected. As detailed above, the transverse expansion may be further achieved using a nozzle design, such as via the geometries of the inlet 302, the undercut 318, and/or the channel 316. The flow paths produce single-phase, transversely expanding fluid jets that provide effective cooling without atomization or other resource-intensive techniques, e.g., based solely on the geometry of the flow paths 138, including the channel 316 and/or the nozzle formed at least in part by the undercut 318.

As will be appreciated, modifications to the nozzle plate 106 may be contemplated. For example, the number and arrangement of the flow paths 138 will impact a surface area impinged by the jets. Moreover, each of the flow paths 138 may be configured to have a specific pressure loss profile as a function of flow rate and/or the number of flow paths may be selected to limit the total flow of fluid at a specific pressure loss. Moreover, a distance between the nozzle plate and the base may be modified to alter the surface area associated with impingement, e.g., a larger distance will result in a larger surface area, but lower velocity at impingement, whereas a shorter distance will provide a reduced surface area, but higher velocity, at impingement. In examples, the height of the nozzle plate relative to the base may be altered by adjusting a distance of the first ledge 124a from the bottom surface 118 of the frame 104. In some examples, the nozzle plate 106 may be from about 0.1 to about 10 mm from the impingement surface, where the impingement surface may be the fins 114 and/or the top surface 112 of the base 102. In some examples, the inventors have found that the distance of the nozzle plate 106 from the impingement surface may be minimized relative to conventional arrangements. For instance, because the jets produced by the flow paths 138 are expanding through the thickness of the nozzle plate 106, the area of impingement proximate the outlets 304 may provide sufficient cooling. Accordingly, reduced distances, e.g., from about 0.1 mm to about 1 mm may provide improvements such as those described herein, and with a reduced profile for the cooling apparatus 100.

As illustrated in FIG. 5A, the jets, generally shown by the arrows 508 have a horizontal component, e.g., in the x-direction, and the fins 114 are generally arranged in this same direction. As a result, the angled jets may act to "push" fluid along the base 102. In some examples, the jets may be angled toward the outlet port 132. Moreover, by aligning the angled jets generally as shown in the examples, jets further from the outlet port 132 will "push" fluid coming from jets closer to the outlet port 132 toward the outlet port 132, to effectively carry heat toward the outlet port 132. In the illustrated example, the jets are angled to push fluid along channels formed between the fins 114. However, in other examples the fins 114 may be rotated about the z-dimension, such that the horizontal component of the emerging jets is not in line with the fins 114. For example, configuring the nozzle plate 106 to be normal to the shown orientation may result in the angled jets contacting faces of the fins 114, which may improve heat dissipation in some examples. In this instance, fluid may collect in the channels between the fins 114 and/or move laterally relative to a direction of the outlet. The fluid may be otherwise directed toward the outlet e.g., using additional channels, by re-positioning the outlet, or the like. Also, although examples described herein illustrate the flow paths 138 as being substantially aligned, e.g., having a same or similar offset between inlet and outlet, such is not required. In other examples, the flow paths 138 may be configured to direct flow in multiple directions, including two directions that are substantially opposite each, that are normal to each other, that converge, or that are otherwise angled relative to each other. In additional examples, the flow paths 138 may direct fluid in three or more directions, e.g., four orthogonal directions. The flow paths 138 alternatively may be configured to direct flow radially inwardly, e.g., toward a center point, a point proximate the outlet, or the like, or to direct flow radially outwardly, e.g., diverging from a point or region. In some examples, the arrangement of the flow paths 138 and the transversely expanding jets resulting therefrom may be configured to complement a fin arrangement on the base 102, based on a thermal load of the component to which the cooling apparatus 100 is to be secured, or the like.

Figure 6A:
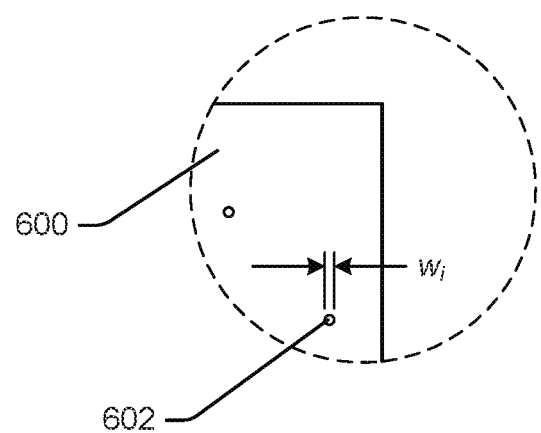
FIGS. 6A-6C are example nozzle plates for use in a cooling apparatus and having differing inlet profiles, in accordance with aspects of this disclosure.
Figure 6B:
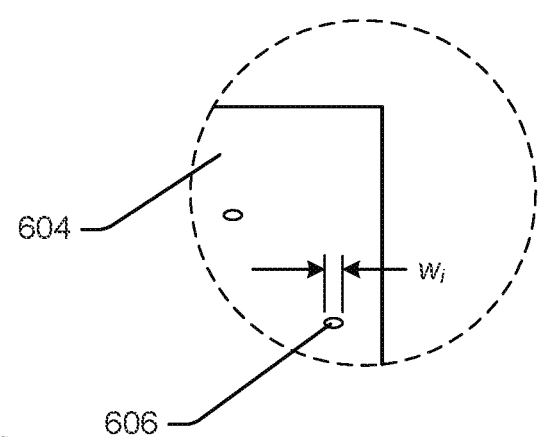
Figure 6C:
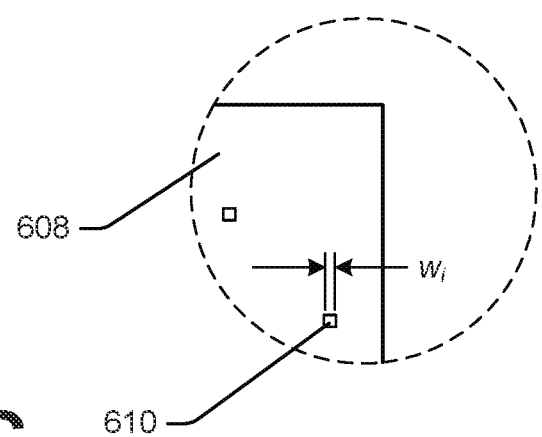

FIGS. 6A-6C show portions of additional examples of nozzle plates, like the nozzle plate 106. More specifically, FIGS. 6A-6C may be substantially the same as the magnified portion 304 of FIG. 3A, but with varied inlets. FIG. 6A shows a first nozzle plate 600 in which first inlets 602, e.g., which are inlets to flow paths such as the flow paths 138, are substantially circular. Here the inlet width, $w_i$, is a diameter of the circular inlet 602. FIG. 6B shows a second nozzle plate 604 in which second inlets 606, e.g., which are inlets to flow paths such as the flow paths 138, are oval. In this example, the inlet width, $w_i$, is the major diameter of the oval inlet 606. In other examples, the inlets 606 may be rotated relative to the orientation shown. FIG. 6C shows a third nozzle plate 608 in which the third inlets 610, e.g., which are inlets to flow paths such as the flow paths 138, are substantially square. In this example, the inlet width, $w_i$, is a length of a side of the square inlet 610. As will be appreciated, inlet configurations other than those illustrated herein may be used without departing from the spirit and scope of the disclosure.

Figure 7A:
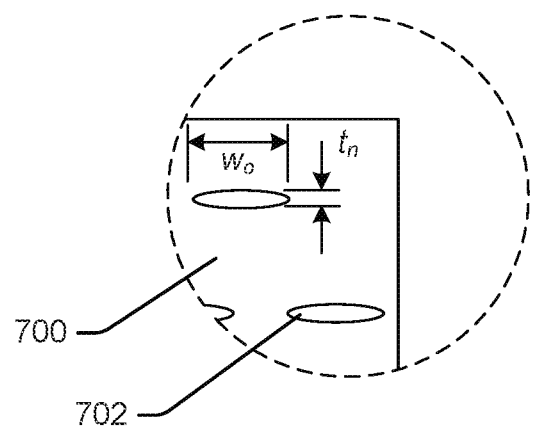
FIGS. 7A and 7B are example nozzle plates for use in a cooling apparatus and having differing inlet profiles, in accordance with aspects of this disclosure.
Figure 7B:
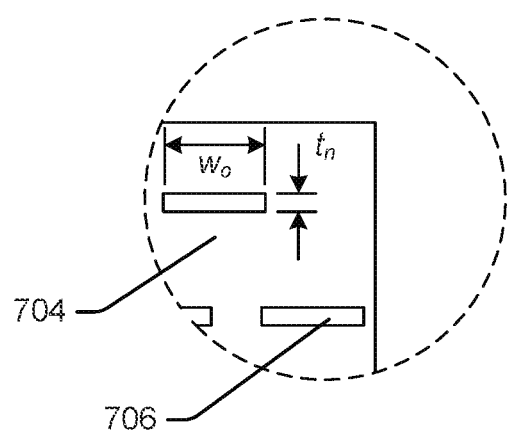

FIGS. 7A and 7B show portions of additional examples of nozzle plates, like the nozzle plate 106. More specifically, FIGS. 7A and 7B may be substantially the same as the magnified portion 308 of FIG. 3B, but with varied outlet configurations. FIG. 7A shows a first nozzle plate 700 in which first outlets 702, e.g., which are outlets of flow paths such as the flow paths 138, are substantially oval. In this example the outlet width, $w_o$, is a major diameter of the oval outlet 702. As described herein, the outlet width, $w_o$, may be chosen to achieve the desired transversely-expanding, single phase fluid jets, e.g., in conjunction with the inlet and/or a nozzle-like geometry proximate the inlet. FIG. 7B shows a second nozzle plate 704 in which second outlets 706, e.g., which are outlets of flow paths such as the flow paths 138, are substantially rectangular. In this example, the outlet width, $w_o$, is the length of a longer side of the of the rectangular outlet 706. As described herein, the outlet width, $w_o$, may be chosen to achieve the desired transversely-expanding, single phase fluid jets, e.g., in conjunction with the inlet and/or a nozzle-like geometry proximate the inlet. As will be appreciated, outlets other than those illustrated herein may be used without departing from the spirit and scope of the disclosure. For instance, other polygonal, arcuate, linear, and/or other configurations may be used.

Figure 8A:
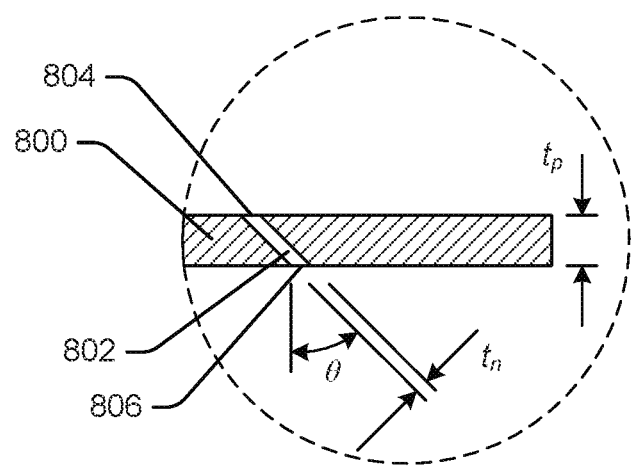
FIGS. 8A and 8B are cross-sectional views of example nozzle plates for use in a cooling apparatus and illustrating varied channel profiles, in accordance with aspects of this disclosure.
Figure 8B:
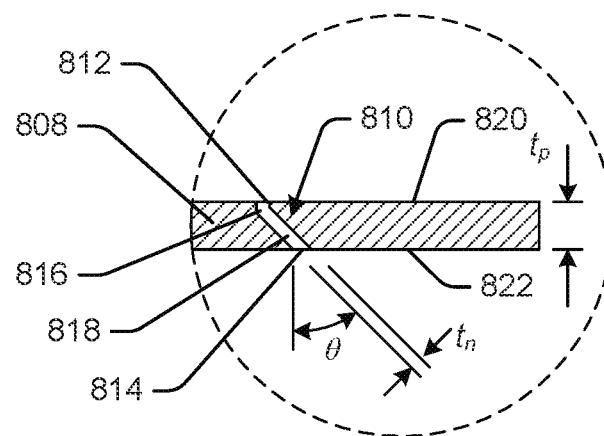

FIGS. 8A and 8B show portions of additional examples of nozzle plates, like the nozzle plate 106. More specifically, FIGS. 8A and 8B may be substantially the same as the magnified portion 318 of FIG. 3B, but with varied flow path configurations. FIG. 8A shows a first nozzle plate 800 in which a first flow path 802, e.g., which may correspond to one of the flow paths 138, extends from an inlet 804 to an outlet 806. For example, the inlet 804 may be any of the inlets described herein and the outlet 806 may be any of the outlets described herein. The flow path 802 comprises a single channel having a substantially constant thickness, $t_n$, from the inlet 804 to the outlet 806, unlike the channel 316, which included the undercut 318. The flow path 802 may result in a larger inlet thickness, than that shown in FIG. 3A, e.g., the inlet thickness, $t_i$, and the outlet thickness, to, may be the same. In this arrangement, the nozzle-effect discussed above, in which geometry proximate the inlet causes transverse expansion of fluid, may not be as apparent, although because the flow path 802 includes a channel angled relative to a top surface of the nozzle plate 800, some expansion may occur. Regardless, the expansion of the flow path 802, e.g., in a direction normal to the plane of FIG. 8A, will still result in transversely expanding jets exiting the outlet 806, in accordance with aspects of this disclosure. Alternatively, the nozzle thickness, $t_n$, may be vary from the inlet 802 to the outlet 804.

FIG. 8B shows a second nozzle plate 808 in which a second flow path 812, e.g., which may correspond to one of the flow paths 138, extends from an inlet 812 to an outlet 814. For example, the inlet 812 may be any of the inlets described herein and the outlet 814 may be any of the outlets described herein. The flow path 810 has a nozzle portion 816 proximate the inlet 812 and a channel portion 818 proximate the outlet 814. In this example, the flow path 810 has a substantially constant thickness, $t_n$, from the inlet 804 to the outlet 806, unlike the flow path of FIG. 3C, which included the undercut 318 as the nozzle portion. However, instead of extending generally along a constant axis, as with the channel 802 and the channel 316, the nozzle portion 816 is angled relative to the channel section 818. More specifically, the nozzle section 816 is substantially normal to a top surface 820 of the nozzle plate 808, and the channel section 818 is angled, e.g., at a channel angle θ relative to a bottom surface 822 of the nozzle plate 808. As described herein, cooling apparatuses like those described herein may be configurable to allow for fluid to enter the inlet volume above the nozzle plate 808 from a number of different directions. Forming the nozzle section 816 of the flow path 810 substantially normal to the top surface 818 may ensure consistent functionality of the nozzle plate 808, regardless of a relative orientation. Moreover, the nozzle section 816, as with the undercut 318 discussed above, may impart a transverse expansion, e.g., at a transition from the nozzle section 816 to the channel section 818, on fluid passing through the flow path 810, as in the example of FIG. 3C discussed above.

Although not visible in the examples shown in FIGS. 8A and 8B, the width of the flow paths 802, 810 expand laterally, e.g., in a direction normal to the plane of the FIGS. 8A and 8B, from a position proximate the respective inlet 804, 812 to the respective outlet 806, 814 to provide the transversely expanding fluid flow. In the example of FIG. 8B, the nozzle section 816 may have a constant lateral width, but the channel section 818 may expand laterally. As will be appreciated, flow paths other than those illustrated herein may be used without departing from the spirit and scope of the disclosure.

It will be appreciated that the foregoing description provides examples of the disclosed system and technique. However, it is contemplated that other implementations of the disclosure may differ in detail from the foregoing examples. All references to the disclosure or examples thereof are intended to reference the particular example being discussed at that point and are not intended to imply any limitation as to the scope of the disclosure more generally. All language of distinction and disparagement with respect to certain features is intended to indicate a lack of preference for those features, but not to exclude such from the scope of the disclosure entirely unless otherwise indicated.

Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context.

While aspects of the present disclosure have been particularly shown and described with reference to the embodiments above, it will be understood by those skilled in the art that various additional embodiments may be contemplated by the modification of the disclosed machines, systems, and methods without departing from the spirit and scope of what is disclosed. Such embodiments should be understood to fall within the scope of the present disclosure as determined based upon the claims and any equivalents thereof.

What is claimed is:

1. A cooling apparatus comprising:
   a base configured for securement proximate an electronic component;
   a cover coupled to the base;
   a nozzle plate coupled to the base and the cover, the nozzle plate dividing an interior volume of the cooling apparatus into a first volume defined, at least in part, by an interior surface of the cover and a first surface of the nozzle plate and a second volume defined, at least in part, by the base and a second surface of the nozzle plate, the nozzle plate comprising:
      a plurality of flow paths extending from the first surface of the nozzle plate to the second surface of the nozzle plate, an individual flow path of the plurality of flow paths comprising a channel extending from an inlet in the first surface of the nozzle plate to an outlet in the second surface of the nozzle plate, the inlet having a first area in a plane of the first surface and the outlet having a second area, in a plane of the second surface, different from the first area such that single-phase fluid in the first volume passes through the nozzle plate via the plurality of flow paths and enters the second volume, wherein the inlet and the outlet are axially offset, such that at least a portion of the individual flow path is angled relative to a direction normal to at least one of the first surface or the second surface;
   an inlet port configured to provide the single-phase fluid to the first volume; and
   an outlet port configured to allow the single-phase fluid to exit the second volume, wherein the cover comprises a protrusion extending from an inner surface of the cover in a direction toward the first surface of the nozzle plate, the protrusion extending into the first volume to a position spaced from the first surface of nozzle plate, the protrusion being aligned with the inlet port such that single-phase fluid entering the first volume through the inlet port contacts the protrusion and is diverted within the first volume.

2. The cooling apparatus of claim 1, wherein the inlet of the individual flow path has a first lateral width, and the outlet of the individual flow path has a second lateral width different from the first lateral width.

3. The cooling apparatus of claim 1, wherein the single-phase fluid enters the second volume as a fluid jet.

4. The cooling apparatus of claim 1, wherein the individual flow path is angled such that a fluid jet is directed in a direction at least partially toward the outlet port.

5. The cooling apparatus of claim 1, wherein the individual flow path comprises a nozzle proximate the inlet.

6. The cooling apparatus of claim 5, wherein the channel is in fluid communication with an outlet of the nozzle and is angled relative to the second surface of the nozzle plate at the outlet.

7. The cooling apparatus of claim 1, wherein:
   at least a portion of the single-phase fluid entering the first volume contacts and is diverted by the protrusion.

8. The cooling apparatus of claim 1, wherein:
   the cover comprises a first portion comprising the inlet port and a second portion fixed relative to the base; and
   the first portion is configurable relative to the second portion in at least a first configuration in which the inlet port has a first orientation relative to the second portion and a second configuration in which the inlet port has a second orientation relative to the second portion.

9. A nozzle plate for use with a cooling apparatus, the nozzle plate comprising:
   a first surface configured for being in fluid contact with an inlet volume of a cooling apparatus, the inlet volume containing a single phase fluid;
   a second surface opposite the first surface configured for being in fluid contact with an outlet volume of the cooling apparatus; and
   a plurality of flow paths extending through the nozzle plate from the first surface of the nozzle plate to the second surface of the nozzle plate, an individual flow path of the plurality of flow paths comprising a channel extending from an inlet in the first surface of the nozzle plate to an outlet in the second surface of the nozzle plate, wherein the inlet has a first area in a plane of the first surface and the outlet has a second area, in a plane of the second surface, wherein the first area has a first polygonal shape and the second area has a second polygonal shape different from the first polygonal shape, and wherein the inlet and the outlet are axially offset, such that at least a portion of the individual flow path is angled relative to a direction normal to at least one of the first surface or the second surface.

10. The nozzle plate of claim 9, wherein:
    the inlet of the individual flow path has a first lateral width; and
    the outlet of the individual flow path has a second lateral width different from the first lateral width.

11. The nozzle plate of claim 9, wherein the single-phase fluid exits the outlet as fluid jets.

12. The nozzle plate of claim 9, wherein the individual flow path is angled such that a fluid jet is directed in a direction at least partially toward an outlet port associated with the outlet volume.

13. The nozzle plate of claim 9, wherein the individual flow path comprises a nozzle proximate the inlet.

14. The nozzle plate of claim 13, wherein the channel is in fluid communication with an outlet of the nozzle and is angled relative to the second surface of the nozzle plate at the outlet.

15. An apparatus comprising:
an electronic component generating heat; and
a cooling apparatus coupled to the electronic component, the cooling apparatus comprising:
  a base in contact with the electronic component;
  a cover coupled to the base to define an inner volume; and
  a nozzle plate coupled to the base and the cover, the nozzle plate dividing the volume into an inlet volume and an outlet volume and comprising a plurality of flow paths fluidly connecting the inlet volume to the outlet volume, an individual flow path of the plurality of flow paths comprising a channel extending from an inlet in a first side of the nozzle plate exposed to the inlet volume to an outlet in a second side of the nozzle plate, opposite the first side and exposed to the outlet volume, a width of the channel changing from the inlet to the outlet and the inlet and the outlet being axially offset, such that at least a portion of the individual flow path is angled relative to a direction normal to at least one of the first side or the second side,
wherein the cover comprises a planar inner surface facing the first side of the nozzle plate and defining a portion of the inner volume, the planar inner surface being angled relative to the first side of the nozzle plate such that a distance between the planar inner surface and the first side of the nozzle plate is greater proximate a fluid inlet than a distance between the planar inner surface and the first side of the nozzle plate at positions spaced from the fluid inlet.

16. The apparatus of claim 15, wherein the channel is angled such that a fluid jet exiting the outlet impinges a surface of the base at an angle.

17. The apparatus of claim 15, wherein the individual flow path comprises a nozzle proximate the inlet.

18. The apparatus of claim 17, wherein the nozzle is formed, at least in part, by a surface angled relative to the channel at the inlet.

19. The apparatus of claim 15, wherein the cover further comprises:
an inlet port in fluid communication with the inlet volume, the inlet port being configured to introduce fluid into the inlet volume in a direction substantially parallel to one of the planar inner surface or the first side of the nozzle plate.

20. The apparatus of claim 15, wherein:
the cover comprises a first portion comprising an inlet port and a second portion fixed relative to the base; and
the first portion is configurable relative to the second portion in at least a first configuration in which the inlet port has a first orientation relative to the second portion and a second configuration in which the inlet port has a second orientation relative to the second portion.

* * * * *